(12) United States Patent
Balakrishnan et al.

(10) Patent No.: US 10,593,669 B2
(45) Date of Patent: *Mar. 17, 2020

(54) DIODE CONNECTED VERTICAL TRANSISTOR

(71) Applicant: INTERNATIONAL BUSINESS MACHINES CORPORATION, Armonk, NY (US)

(72) Inventors: Karthik Balakrishnan, Scarsdale, NY (US); Pouya Hashemi, Purchase, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/400,133

(22) Filed: May 1, 2019

(65) Prior Publication Data

US 2019/0259750 A1 Aug. 22, 2019

Related U.S. Application Data

(63) Continuation of application No. 16/359,298, filed on Mar. 20, 2019, which is a continuation of application
(Continued)

(51) Int. Cl.
*H01L 27/07* (2006.01)
*H01L 29/66* (2006.01)
(Continued)

(52) U.S. Cl.
CPC .......... *H01L 27/0727* (2013.01); *G11C 7/062* (2013.01); *H01L 21/823456* (2013.01);
(Continued)

(58) Field of Classification Search
CPC .......... H01L 27/0727; H01L 29/66136; H01L 29/66356; H01L 29/7391; H01L 29/7827; H01L 29/8613
See application file for complete search history.

(56) References Cited

U.S. PATENT DOCUMENTS 9,368,640 B2   6/2016 Yamazaki
9,583,615 B2   2/2017 Chen et al.
(Continued)

OTHER PUBLICATIONS

Moroz, V. et al., "Modeling and Optimization of Group IV and III-V FinFETs and Nano-Wires" 2014 IEEE International Electron Devices Meeting (IEDM) (Dec. 2014) pp. 1-4.
(Continued)

*Primary Examiner* — Christine A Enad
(74) *Attorney, Agent, or Firm* — Tutunjian & Bitetto, P.C.; L. Jeffrey Kelly

(57) ABSTRACT

An electrical device including a vertical transistor device connected to a vertical diode. The vertical diode connected transistor device including a vertically orientated channel. The vertical diode connected transistor device also includes a first diode source/drain region provided by an electrically conductive surface region of a substrate at a first end of the diode vertically orientated channel, and a second diode source/drain region present at a second end of the vertically orientated channel. The vertical diode also includes a diode gate structure in electrical contact with the first diode source/drain region.

20 Claims, 8 Drawing Sheets

Related U.S. Application Data

No. 15/907,908, filed on Feb. 28, 2018, now Pat. No. 10,312,234, which is a continuation of application No. 15/459,574, filed on Mar. 15, 2017, now Pat. No. 9,953,973.

(51) Int. Cl.
    | | |
    |---|---|
    | *H01L 29/78* | (2006.01) |
    | *H01L 29/739* | (2006.01) |
    | *H01L 21/8234* | (2006.01) |
    | *G11C 7/06* | (2006.01) |
    | *G11C 11/4091* | (2006.01) |
    | *H01L 29/861* | (2006.01) |

(52) U.S. Cl.
    CPC ........... *H01L 21/823487* (2013.01); *H01L 29/66136* (2013.01); *H01L 29/66356* (2013.01); *H01L 29/66666* (2013.01); *H01L 29/7827* (2013.01); *G11C 11/4091* (2013.01); *H01L 21/823475* (2013.01); *H01L 29/7391* (2013.01); *H01L 29/861* (2013.01)

(56) References Cited

U.S. PATENT DOCUMENTS

| | | | |
|---|---|---|---|
| 2009/0039869 A1* | 2/2009 | Williams | H01L 23/49575 324/123 R |
| 2011/0303985 A1* | 12/2011 | Masuoka | H01L 21/84 257/369 |
| 2013/0235648 A1* | 9/2013 | Kim | G11C 13/0069 365/148 |
| 2015/0243707 A1* | 8/2015 | Park | H01L 27/2454 257/2 |
| 2015/0380925 A1 | 12/2015 | Rouviere et al. | |
| 2016/0293756 A1 | 10/2016 | Liu et al. | |

OTHER PUBLICATIONS

U.S. Office Action Issued in U.S. Appl. No. 15/830,497 dated Jan. 12, 2018, 7 pages.

List of IBM Patents or Patent Applications Treated as Related dated May 1, 2019, 2 pages.

* cited by examiner

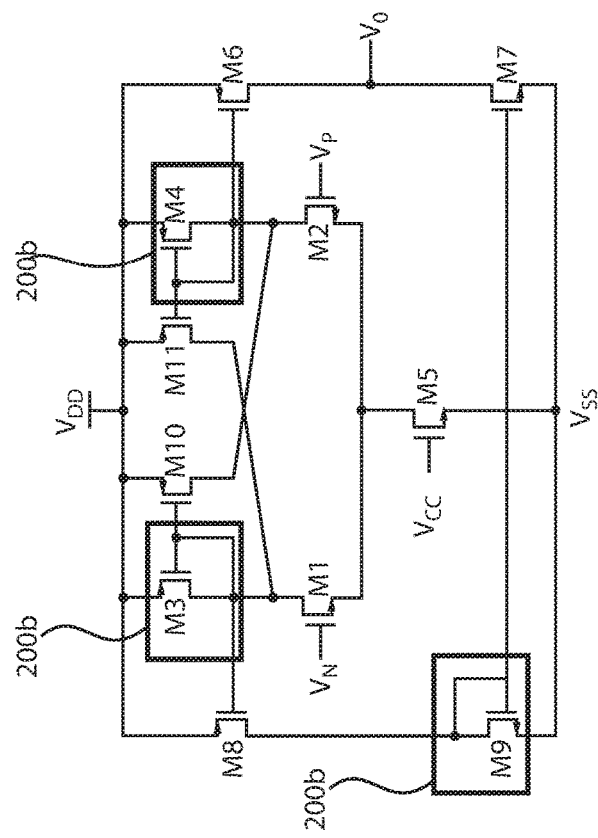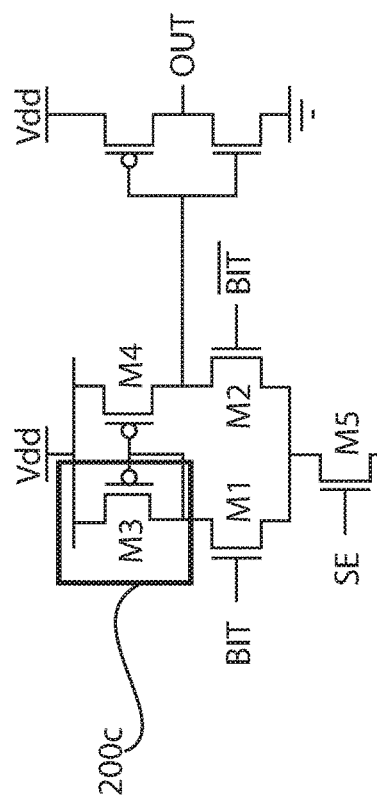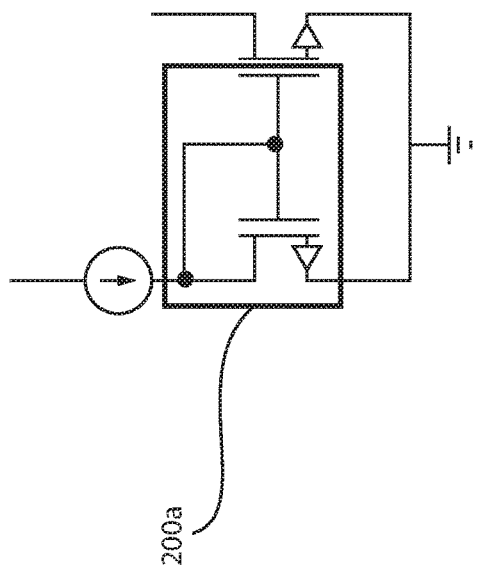
FIG. 2A
FIG. 2B
FIG. 2C

DIODE CONNECTED VERTICAL TRANSISTOR

BACKGROUND

Technical Field

The present disclosure relates to vertical transistors and memory devices.

Description of the Related Art

Modern integrated circuits are made up of literally millions of active devices such as transistors and memory devices. The geometry of vertical transistors is attractive due to their potential density with increased scaling requirements. Further vertical transistors can allow for relaxed gate lengths to better control electrostatics. New memory structures are desired to integrate with vertical transistors.

SUMMARY

In one embodiment, the methods and structures that are described herein provide a diode connected vertical transistor, in which only two terminal contacts are required for the diode. In one embodiment, the electrical device comprises a semiconductor substrate including an electrically conductive surface region. The electrical device includes a transistor device including a transistor vertically orientated channel is present in a first region of the semiconductor substrate. The transistor device may include a first transistor source/drain region that is provided by the electrically conductive surface region at a first end of the transistor vertically orientated channel region, and a transistor gate structure that is separated from the first transistor source/drain region of the transistor by a dielectric spacer. The electrical device may also include a diode connected transistor device having a second vertically orientated channel present in a second region of the semiconductor substrate. The diode connected transistor device may further include a first diode source/drain region provided by the electrically conductive surface region at a first end of the diode vertically orientated channel, and a diode gate structure in electrical contact with the first diode source/drain region.

In one embodiment, an electrical device is provided that includes a semiconductor substrate including an electrically conductive surface region, a transistor device in a first region of the semiconductor substrate, and a diode connected transistor device in a second region of the semiconductor substrate. The transistor device includes a transistor vertically orientated channel. The transistor device includes a first transistor source/drain region that is provided by the electrically conductive surface region at a first end of the transistor vertically orientated channel region, a transistor gate structure that is separated from the first transistor source/drain region of the transistor by a dielectric spacer, and a second transistor source/drain region that is present at an opposing second end of the vertically orientated channel. The diode connected transistor device may include a second vertically orientated channel. The diode connected transistor device may further include a first diode source/drain region provided by the electrically conductive surface region at a first end of the diode vertically orientated channel, a diode gate structure in electrical contact with the first diode source/drain region, and a second diode source/drain at a second end of the diode vertically orientated channel.

In another aspect of the present disclosure, a method is described for forming a diode connected vertical transistor. In some embodiments, the method may include providing a semiconductor substrate including an electrically conductive surface region. A transistor device is formed in a first region of the semiconductor substrate comprising a transistor vertically orientated channel, a first transistor source/drain region that is provided by the electrically conductive surface region at a first end of the transistor vertically orientated channel region, and a transistor gate structure that is separated from the first transistor source/drain region of the transistor by a dielectric spacer. A diode connected transistor device is formed in a second region of the semiconductor substrate comprising a second vertically orientated channel, a first diode source/drain region provided by the electrically conductive surface region at a first end of the diode vertically orientated channel, and a diode gate structure in electrical contact with the first diode source/drain region.

BRIEF DESCRIPTION OF DRAWINGS

The disclosure will provide details in the following description of preferred embodiments with reference to the following figures wherein:

FIG. 2A is a circuit diagram of a current mirror employing the diode connected VFET that is depicted in FIGS. 1A and 1B.

FIG. 2B is a circuit diagram of a comparator employing the diode connected VFET that is depicted in FIGS. 1A and 1B.

FIG. 2C is a circuit diagram for a sense amplifier employing the diode connected VFET that is depicted in FIGS. 1A and 1B.

DETAILED DESCRIPTION OF PREFERRED EMBODIMENTS

Figure 1A:
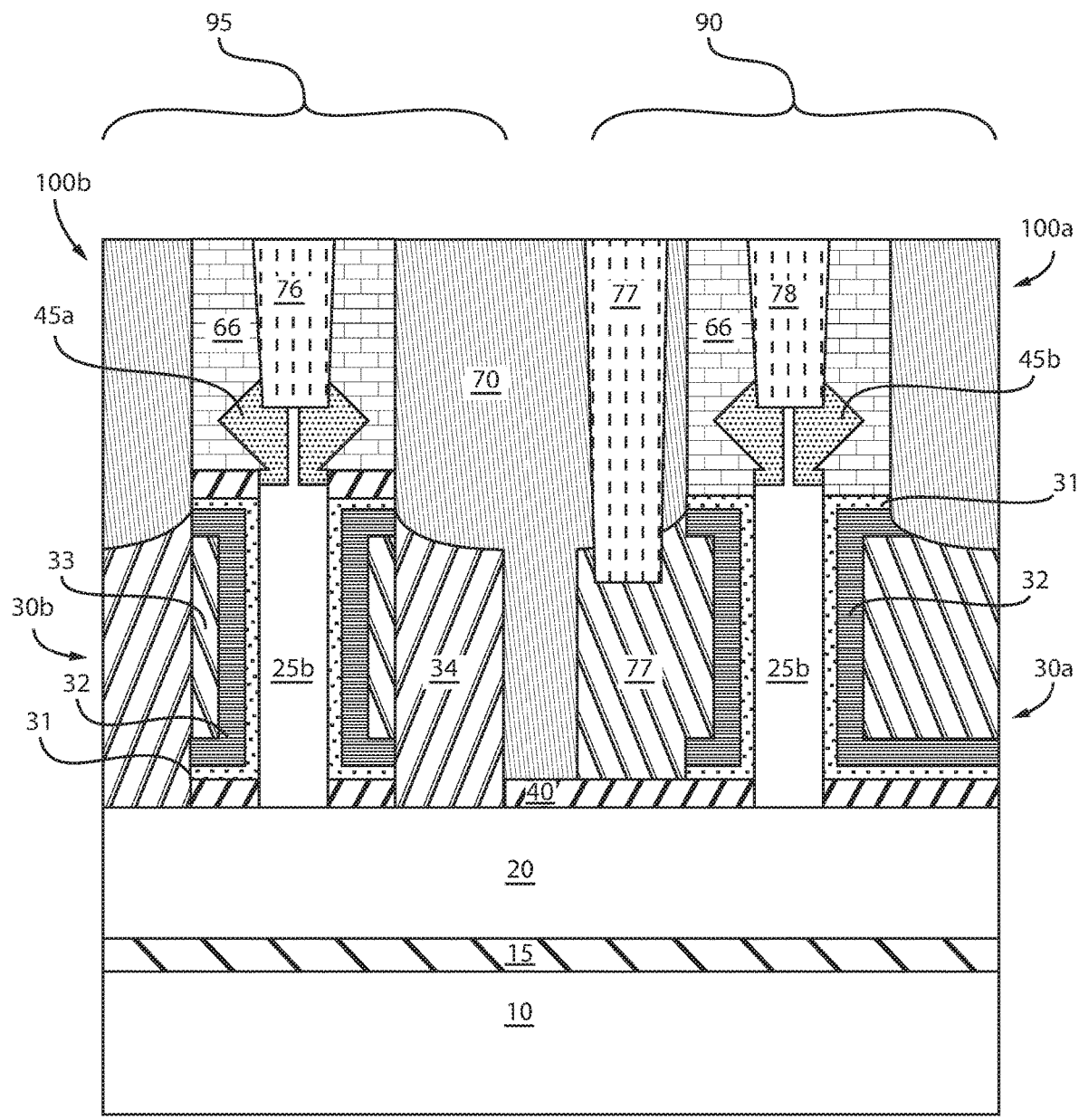
FIG. 1A is a side cross-sectional view of one embodiment of a vertically orientated field effect transistor (VFET) alongside a vertically orientated diode connected transistor device, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "present on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

With increasing scaling for next generation semiconductor devices, vertical field effect transistors (vFETs) have become increasingly attractive. For example, vertical FET devices are attractive for 5 nm device architecture due to sub-30 nm fin pitch and since they are not constrained by the contact poly pitch (CPP) and gate width scaling. Vertical transistors are attractive candidates for 5 nm node and beyond due to their potential of better density scaling and allowing relaxed gate lengths to better control the electrostatics. A transistor is a device that regulates current or voltage flow and acts as a switch or gate for electronic signals. In the embodiments described herein, the transistors are field effect transistors (FETs). As used herein a "field effect transistor" is a transistor in which output current, i.e., source-drain current, is controlled by the voltage applied to the gate. A field effect transistor has three terminals, i.e., gate, source and drain. A "gate structure" means a structure used to control output current (i.e., flow of carriers in the channel) of a semiconducting device through electrical fields. As used herein, the term "drain" means a doped region in semiconductor device located at the end of the channel, in which carriers are flowing out of the transistor through the drain. As used herein, the term "source" is a doped region in the semiconductor device, in which majority carriers are flowing into the channel. The field effect transistors of the present disclosure have a vertically orientated channel region that ca n be present within a fin structure. As used herein, a "fin structure" refers to a semiconductor material, which is employed as the body of a semiconductor device, in which the gate structure is positioned around the fin structure such that charge flows down the channel of the fin structure A finFET is a semiconductor device that positions the channel region of the semiconductor device in a fin structure. As used herein, the term "channel" is the region adjacent to the gate structure and between the source and drain of a semiconductor device that becomes conductive when the semiconductor device is turned on. The source and drain regions of the fin structure are the portions of the fin structure that are on opposing sides of the channel region of the fin structure. A "vertical" finFET semiconductor device has the drain, fin channel, and source device components arranged perpendicular to the plane of the substrate surface, which is referred to as a vertical stack. A vertically stacked finFET can have a longer gate length (i.e., height) and larger dielectric spacer than a horizontal (i.e., having the drain, fin channel, and source device components arranged parallel with the plane of the substrate surface) finFET having comparable contact gate pitch.

Diode connected transistors are commonly used in analog circuits, such as comparators, current mirrors, operational amplifiers, and combinations thereof. The term "diode connected transistor" denotes a transistor having source region and a gate structure that are electrically connected in order to mimic the electrical behavior of a diode. The most common function of a diode is to allow an electric current to pass in one direction (called the diode's forward direction), while blocking current in the opposite direction (the reverse direction). By vertically orientating the diode connected transistor structure that is in electrical communication with the vertical field effect transistors (VFETs), the methods and structures that are described herein allow for increased device density and reduced interconnect routing congestion. As will be further described below, the methods and structures described herein allow for a diode connected vertical transistor, in which only two terminal contacts are required. The diode disclosed herein is formed using vertical field effect transistor (VFET) process flow that includes processing steps to short the gate conductor to the source region of the device. Some embodiments of structures disclosed herein, are now described in more detail with reference to FIGS. 1A and 1B.

Figure 1B:
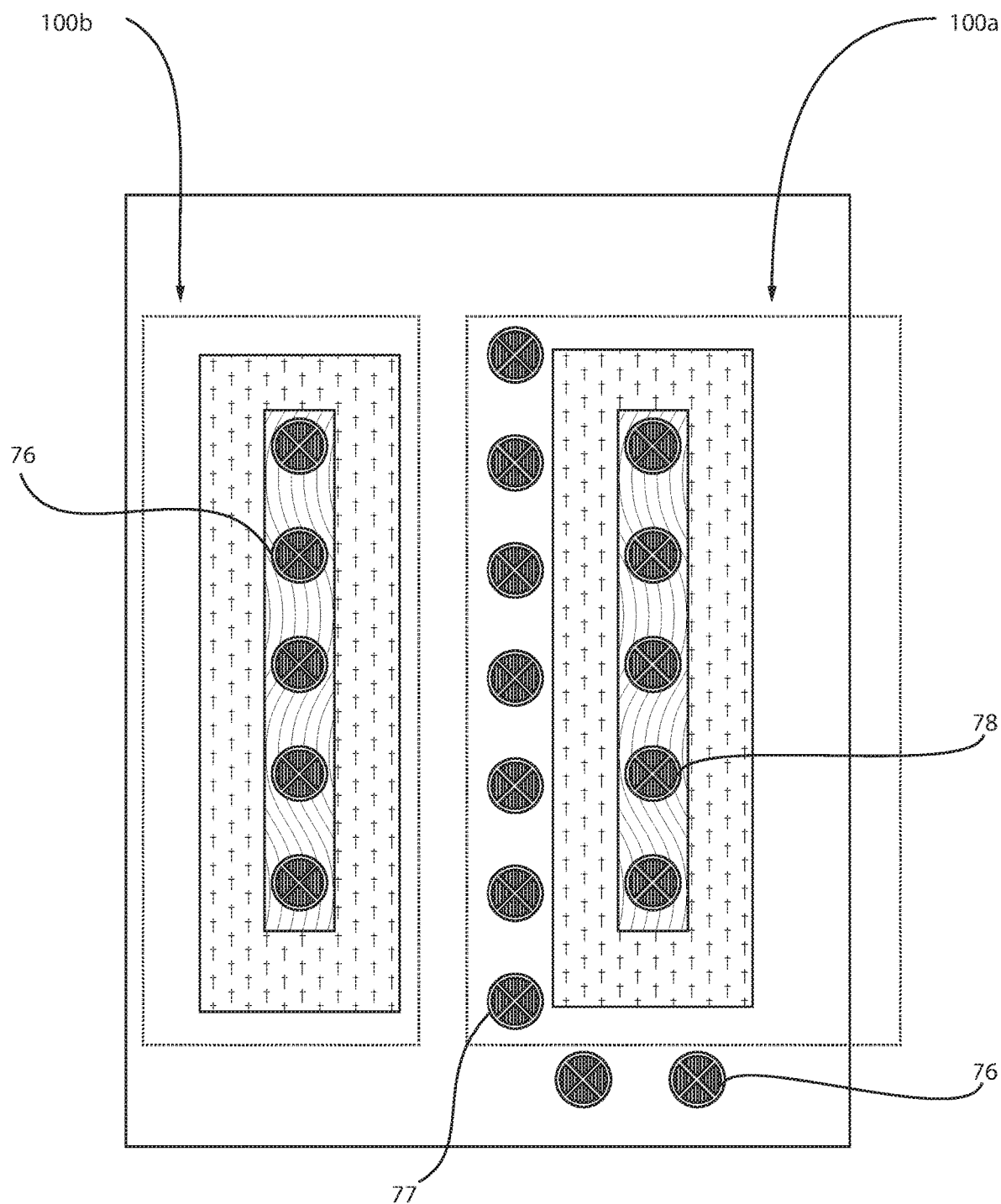
FIG. 1B is a top down view of the structure depicted in FIG. 1A, in which the structure depicted in FIG. 1A is along section line A-A of FIG. 1B.

Referring to FIGS. 1A and 1B, in some embodiments, an electrical device is provided that includes a semiconductor substrate 10 including an electrically conductive surface region 15. A transistor device 100a is present in a first region 90 of the semiconductor substrate 10, and a diode connected transistor device 100b in a second region 95 of the semiconductor substrate 10. The transistor device 100a includes a transistor vertically orientated channel 25a. The transistor device 100a includes a first transistor source/drain region that is provided by the electrically conductive surface region 20 at a first end of the transistor vertically orientated channel region 25a, a transistor gate structure 30a in electrical communication with the transistor vertically orientated channel region 25a, a s a second transistor source/drain region 45a that is present on an opposing side of the transistor vertically orientated channel region 25a. The transistor gate structure 30a is separated from the first transistor source/drain region of the transistor, which is provided by the electrically conductive surface region 20 of the semiconductor substrate 10 by a dielectric spacer 40. The transistor device 100*a* that is depicted in FIGS. 1A and 1B can be a vertically orientated fin type field effect transistor (V fin-FET).

The diode connected transistor device 100*b* is present on the same semiconductor substrate 10 as the transistor device 100*a*. The diode connected transistor device 100*b* is present in a second region 95 of the substrate 10. The diode connected transistor device 100*b* may include a second vertically orientated channel 25*b*. The diode connected transistor device 100*b* may further include a first diode source/drain region provided by the electrically conductive surface region 20 at a first end of the diode vertically orientated channel 25*b*, a diode gate structure 30*b* in electrical contact with the first diode source/drain region, and a second diode source/drain 45*b* at a second end of the diode vertically orientated channel 25*b*.

The first diode source/drain region and the first transistor source/drain region are both provided by the electrically conductive surface region 20 of the substrate 10. Therefore, the first diode source/drain region and the first transistor source/drain region are in electrical communication. In the embodiment depicted in FIGS. 1A and 1B, the first diode source/drain region and the first transistor source/drain region may be source regions, and the electrically conductive surface region 20 may be referred to as a heavily doped source. For example, the electrically conductive surface region 20 may be composed of a type IV or type III-V semiconductor material that is doped with an n-type or p-type dopant to provide the conductivity type of the material layer. In some examples, when the electrically conductive surface region 20 is composed of a type IV semiconductor material, the electrically conductive surface region may be silicon containing or germanium containing, e.g., silicon (Si), monocrystalline silicon (Si), germanium (Ge), silicon germanium (SiGe) and combinations thereof. In some embodiments, when the electrically conductive surface region 20 is composed of a type III-V semiconductor material, the electrically conductive surface region may be composed of gallium arsenide (GaAs). The term "conductivity type" denotes whether the devices which the region have a p-type conductivity or an n-type conductivity. For example, when the transistor device 100*a* is an n-type vertically orientated fin type field effect transistor (V fin-FET) the electrically conductive surface region 15 is doped to an n-type conductivity. In this example, because the transistor first source/drain region and the diode first source/drain region are both provided by the electrically conductive surface region, the first source/drain region of the diode connected transistor device 100*b* is n-type. In another example, when the transistor device 100*b* is a p-type vertically orientated fin type field effect transistor (V fin-FET) the electrically conductive surface region 20 is doped to a p-type conductivity. In this example, because the transistor first source/drain region and the diode first source/drain region are both provided by the electrically conductive surface region 20, the first source/drain region of the diode connected transistor device 100*b* is p-type.

In some embodiments, the electrically conductive surface region 20 may be composed of epitaxially formed semiconductor material, which can be present overlying a supporting semiconductor substrate 10. In some embodiments, the electrically conductive surface region 20 is separated from the supporting semiconductor substrate 10 by a counter doped region 15. The term "counter doped" means that the counter doped region 15 has an opposite conductivity type as the electrically conductive surface region 20 that provides the first transistor source/drain region and the second transistor source/drain region. For example, when the electrically conductive surface region 20 has an n-type conductivity, the counter doped region 15 has a p-type conductivity; and when the first source/drain region 20 that is present in the p-type device region 95 has a p-type conductivity, the counter doped region 15 may have an n-type conductivity.

The counter doped regions 15, and the supporting substrate 10 may each be composed of a semiconductor material, such as a type IV or type III-V semiconductor.

Although the supporting substrate 10 is depicted as a bulk substrate, in other embodiments, the supporting substrate 10 may be a semiconductor on insulator (SOI) substrate.

Each of the transistor device 100*a* and the diode connected transistor device 100*b* may include a fin structure 25*a*, 25*b* for the channel region of the device. Similar to the electrically conductive surface region 20, the counter doped region 15, and the semiconductor substrate 10 each of the fin structures 25*a*, 25*b* may be composed of a semiconductor material, e.g., a type IV semiconductor material, such as silicon or germanium, or a type III-V semiconductor material, such as gallium arsenic (GaAs). The fin structures 25*a*, 25*b* may be formed using an epitaxial growth process.

The fin structures 25*a*, 25*b* may have a height ranging from 5 nm to 200 nm. In another embodiment, each of the fin structures 25*a*, 25*b* has a first height ranging from 10 nm to 100 nm. In one example, each of the fin structures 25*a*, 25*b* has a height ranging from 20 nm to 50 nm. Each of fin structures 25*a*, 25*b* may have a width ranging from 5 nm to 20 nm. In another embodiment, each of the fin structures 25*a*, 25*b* has a width ranging from 5 nm to 15 nm. In one example, each fin structure 25*a*, 25*b* has a width that is equal to 10 nm. The pitch separating adjacent fin structures 25*a*, 25*b* may range from 10 nm to 50 nm. In another embodiment, the pitch separating adjacent fin structures 25*a*, 25*b* may range from 20 nm to 50 nm. In one example, the pitch is equal to 30 nm.

The fin structures 25*a*, 25*b* are typically intrinsic semiconductor materials.

The vertical transistor device 100*a* includes a gate structure 30*a* that is separated from the electrically conductive surface region 20 that provides the first transistor source/drain region by a dielectric spacer 40, which may be referred to as a bottom spacer. The dielectric spacer 40 that electrically isolates the gate structure 30*a* from the first transistor source/drain region of the vertical transistor device 100*a* is not present in the diode connected transistor device 100*b*. For example, the diode connected transistor device 100*b* includes a gate structure that is in electrical communication, e.g., in direct contact with, the electrically conductive surface region 20 that provides the first diode source/drain region.

The gate structures 30*a*, 30*b* to each of the vertical transistor device 100*a* and the vertical diode transistor connected device 100*b* can include a gate dielectric 31, a work function adjusting metal layer 32 and a gate electrode 33, 34. The gate dielectric 31 may be composed of any dielectric material, such as an oxide, nitride or oxynitride material. In some embodiments, the gate dielectric 31 is a high-k dielectric material. As used herein, "high-k" denotes a dielectric material featuring a dielectric constant (k) higher than the dielectric constant of $SiO_2$ at room temperature. For example, the gate dielectric layer 31 may be composed of a high-k oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high-k dielectric materials for the gate dielectric 31 include hafnium silicate, hafnium silicon oxynitride or combinations thereof. In one embodiment, the gate dielectric 31 has a thickness ranging from about 1.0 nm to about 6.0 nm.

Each gate structure 30a, 30b may include a work function adjusting metal layer 32, such as a p-type work function metal layer or an n-type work function metal layer. As used herein, a "p-type work function metal layer" is a metal layer that effectuates a p-type threshold voltage shift. In one embodiment, the work function of the p-type work function metal layer ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero. In one embodiment, the p-type work function metal layer may be composed of titanium and their nitrided/carbide. In one embodiment, the p-type work function metal layer is composed of titanium nitride (TiN). The p-type work function metal layer may also be composed of TiAlN, Ru, Pt, Mo, Co and alloys and combinations thereof. As used herein, an "n-type work function metal layer" is a metal layer that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the work function of the n-type work function metal layer ranges from 4.1 eV to 4.3 eV. In one embodiment, the n-type work function metal layer is composed of at least one of TiAl, TaN, TiN, HfN, HfSi, or combinations thereof.

Each gate structure 30a, 30b may include a gate electrode 33, 34. The gate electrode 33, 34 is present on the work function adjusting metal layer 31. The gate electrode 33 may be composed of a metal, such as tungsten (W), titanium (Ti), tantalum (Ta), aluminum (Al), copper (Cu), platinum (Pt), gold (Au), silver (Ag) or alloys and multilayers thereof, or the gate electrode 33, 34 may be composed of an electrically conductive semiconductor material, such as n-type polysilicon.

Referring to FIG. 1A, the gate electrode 33 for the gate structure 30a of the vertical transistor device 100a is separated from the electrically conductive surface of the substrate by a first dielectric spacer 40. The first dielectric spacer 40 may be composed of any dielectric material, such as an oxide, e.g., silicon oxide, nitride, e.g., silicon nitride, or a combination thereof. The gate electrode 33, 34 for the gate structure 30b of the vertical diode connected transistor device 100b is in direct contact with the electrically conductive surface of the substrate that provides the first source/drain region of the vertically orientated diode.

Still referring to FIGS. 1A and 1B, each of the vertically transistor device 100a and the vertical diode connected transistor device 100b may include a second source/drain region 45a, 45b that is present on the opposite side of the fin structures 25a, 25b that provide the channel regions for the vertical transistor device 100a and the vertical diode connected transistor device 100b than the electrically conductive surface region 20. The second source/drain regions 45a, 45b typically has the same conductivity type as the corresponding first source/drain regions that is provided by the electrically conductive surface region 20 of the substrate. For example, when the electrically conductive surface region 20 is doped to an n-type conductivity, the second/ regions 45a, 45b for each of the vertical transistor device 100a and the vertical diode connected transistor device 100b is also doped to an n-type conductivity. In another example, when the electrically conductive surface region 20 is doped to a p-type conductivity, the second/regions 45a, 45b for each of the vertical transistor device 100a and the vertical diode connected transistor device 100b are also doped to a p-type conductivity. The second source/drain region 45a to the vertical transistor device 100a may be referred to as the second transistor source/drain region 45a, and the second source/drain region 45b to the vertical diode connected transistor device 100b may be referred to as the second diode source/drain region 45b.

Referring to FIG. 1B, the vertical diode connected transistor device 100b is only contacted by two terminals, i.e., via contacts 75, 76. Each of the vertical diode connected transistor device 100b and the vertical transistor device 100a are encapsulated in an interlevel dielectric layer 70. The via contacts 75, 76 that provide the two terminals to the vertical diode connected transistor device 100b include a second diode source/drain contact 76 and an electrically conductive surface region contact 75. The electrically conductive surface region contact 75 provides the via contact to both the first diode source/drain region and the first transistor source/ drain region. The vertical transistor 100a is a three terminal device, in which the terminals are provided by via contacts 75, 77, 78. The via contact identified by reference number The diode connected transistor, i.e., the combination of the vertical transistor device 100a and the vertical diode connected transistor device 100b, that is depicted in FIGS. 1A and 1B may provide a current mirror, as depicted in FIG. 2A, a comparator, as depicted in FIG. 2B, a sense amplifier, as depicted in FIG. 2C, or a combination thereof. A current mirror is a circuit designed to copy a current through one active device by controlling the current in another active device of a circuit, keeping the output current constant regardless of loading. The diode connected transistor is identified by reference number 200a in the current mirror circuit illustrated in FIG. 2A. A comparator is a device that compares two voltages or currents and outputs a digital signal indicating which is larger. The diode connected transistor is identified by reference number 200b in the comparator circuit illustrated in FIG. 2B. A sense amplifier is one of the elements which make up the circuitry on a semiconductor memory chip (integrated circuit). A sense amplifier is part of the read circuitry that is used when data is read from the memory; its role is to sense the low power signals from a bitline that represents a data bit (1 or 0) stored in a memory cell, and amplify the small voltage swing to recognizable logic levels so the data can be interpreted properly by logic outside the memory. The diode connected transistor is identified by reference number 200c in the sense amplifier illustrated in FIG. 2C.

Figure 3:
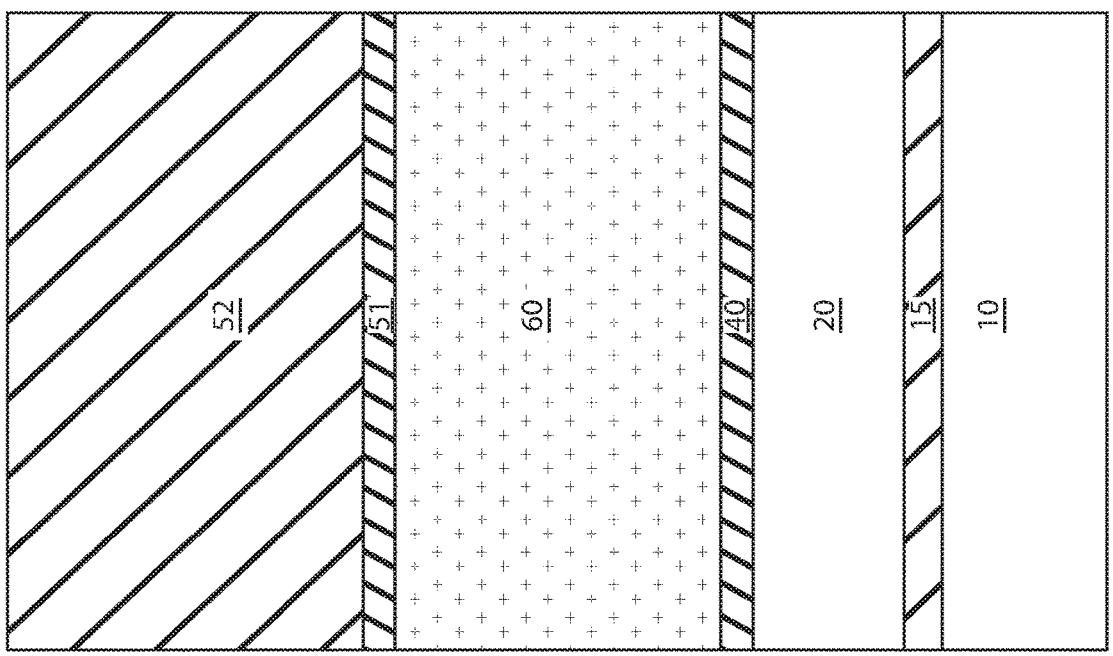
FIG. 3 is a side cross-sectional view depicting a replacement gate stack atop a semiconductor substrate including an electrically conductive surface region, in accordance with one embodiment of the present disclosure.

FIG. 3 depicts a replacement gate stack atop a semiconductor substrate including an electrically conductive surface region. In some embodiments, the initial material stack includes a supporting substrate 10, a counter doped layer 15, and electrically conductive surface region 20. The counter doped layer 15a may be formed on the upper surface of the supporting substrate 10 by ion implantation or by epitaxial growth in combination with in situ doping or ion implantation. The counter doped layer 15 may have a thickness ranging from 5 nm to 50 nm. The material layer for providing the electrically conductive surface region 20 may also be formed using ion implantation or epitaxial growth in combination with ion implantation or in situ doping. The thickness for the material layer for the electrically conductive surface region 20 typically ranges from about 10 nm to about 100 nm.

Still referring to FIG. 3, a first dielectric spacer layer that provides the first spacer 40 (also referred to as bottom spacer) of the vertical transistor device 100a is formed on the upper surface of the electrically conductive surface region 20. The first dielectric spacer layer 40 may be formed using a deposition process, such as chemical vapor deposition (CVD), plasma enhanced chemical vapor deposition (PECVD), metal organic chemical vapor deposition (MOCVD), room temperature chemical vapor deposition (RTCVD), high density plasma chemical vapor deposition (HDPCVD) and combinations thereof. The first dielectric spacer layer that provides the first dielectric spacer 40 may be composed of any dielectric material, and in some instances may be composed of silicon oxide or silicon nitride. In some embodiments, the first spacer 40 can be composed of a low-k material. As used herein, the term "low-k" denotes a dielectric material having a dielectric constant equal to the dielectric constant of silicon oxide ($SiO_2$) or less. Examples of materials suitable for the low-k dielectric material include diamond like carbon (DLC), organosilicate glass (OSG), fluorine doped silicon dioxide, carbon doped silicon dioxide, carbon doped silicon nitride, porous silicon dioxide, porous carbon doped silicon dioxide, boron doped silicon nitride, spin-on organic polymeric dielectrics (e.g., SILK™), spin-on silicone based polymeric dielectric (e.g., hydrogen silsesquioxane (HSQ) and methylsilsesquioxane (MSQ), and combinations thereof. The thickness of the first dielectric spacer layer 40 may range from 5 nm to 20 nm.

A sacrificial gate structure layer 60, which may also be referred to as a dummy gate layer, is present one the first dielectric spacer layer 40. The sacrificial gate structure layer 60 may be composed of any material that can be removed selectively to the first dielectric spacer layer 40. In some embodiments, the sacrificial gate structure layer 60 may be composed of a silicon containing material, such as amorphous silicon (α-Si). The sacrificial gate structure layer 60 may be formed using a deposition process, such as chemical vapor deposition (CVD), plasma enhanced chemical vapor deposition (PECVD), metal organic chemical vapor deposition (MOCVD), room temperature chemical vapor deposition (RTCVD), high density plasma chemical vapor deposition (HDPCVD) and combinations thereof.

A second dielectric spacer layer 51 is formed on the sacrificial gate structure layer 60. The second dielectric spacer layer 51 is similar to the first dielectric spacer layer 40. Therefore, the above description of the composition, thickness and method of forming the first dielectric spacer layer 40 is suitable for describing forming the second dielectric spacer layer 51. For example, the second dielectric spacer layer 51 may be composed of silicon oxide or silicon nitride.

A cap dielectric layer 52 is formed on the second dielectric spacer layer 51. The cap dielectric layer 52 in some examples may be composed of an oxide, such as silicon oxide. The selection of the composition of the cap dielectric layer 52 and the second dielectric spacer layer 51 can be selected to provide that the cap dielectric layer 52 can be removed by an etch process that is selective to the second dielectric spacer layer 51. The second dielectric spacer layer 51 protects the sacrificial gate structure layer 60 from being etched by the process steps that remove the cap dielectric layer 52.

Figure 4:
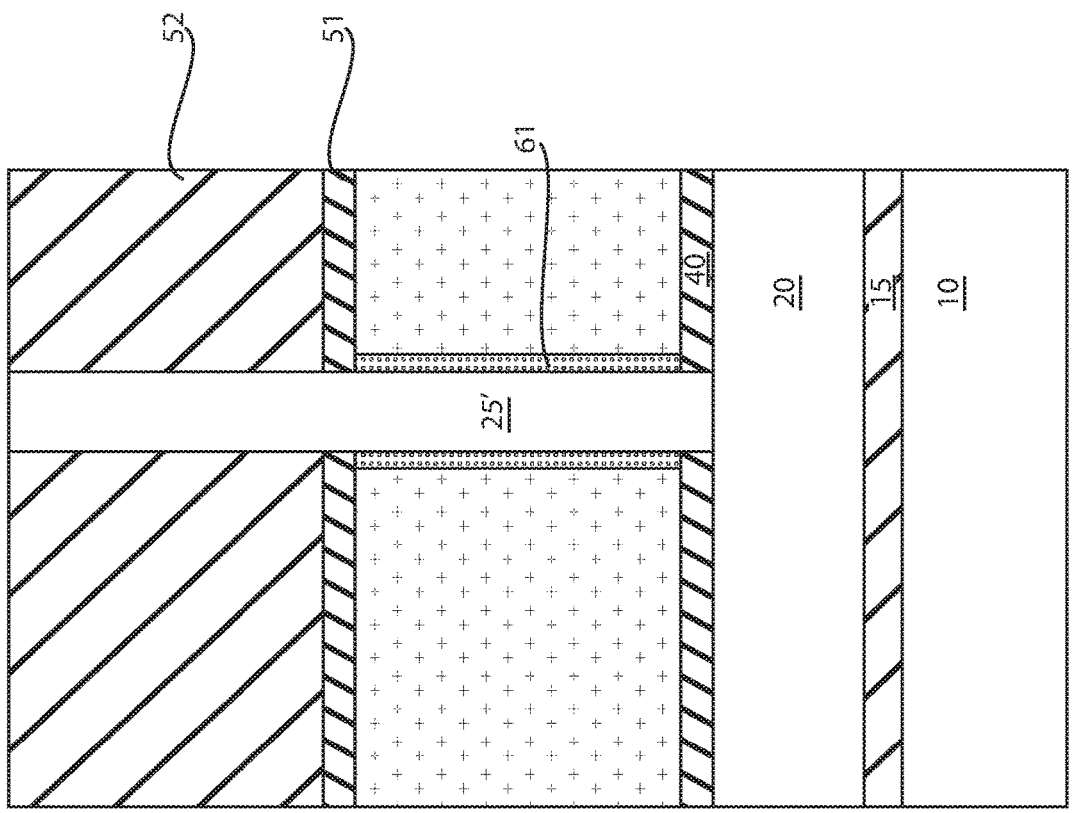
FIG. 4 is a side-cross sectional view depicting forming a fin structure opening in the replacement gate stack, and epitaxially forming a fin structure in the fin structure opening, in accordance with one embodiment of the present disclosure.

FIG. 4 depicts forming a fin structure opening extending to the electrically conductive surface region 20, and epitaxially forming a fin structure 25' in the fin structure opening. The fin structure 25' depicted in FIG. 4 may be used to provide the vertically orientated channel region 25a of the vertical transistors 100a and the vertically orientated channel region 25b of the vertical diode 25. Although FIG. 4 only depicts a single fin structure 25' being formed, this is for the purposes of simplicity. When the fin structure 25' is to provide both the vertically orientated channel region 25a of the vertical transistors 100a and the vertically orientated channel region 25b of the vertical diode 25, two fin structures 25' are formed on the same substrate 10 adjacent to one another. For some steps of the process sequence, the process step applies equally for the fin structure 25' that provides the vertically orientated channel region 25b of the diode, and for an adjacently position fin structure (not depicted) for the vertically oriented channel region 25a of the transistor. For some process steps of the following described process sequence, block masks may be employed to obstruct one fin structure from being impacted by a process sequence that is being applied to the other fin structure.

In some embodiments, forming the fin structures 25' may begin with forming fin structure openings through the material stack to the electrically conductive surface region 20. The fin structure openings are formed using deposition, photolithography and etch processes. First, an etch mask is formed atop the material stack including the sacrificial gate layer 60 having openings exposing the portions of the material stack, in which the fin structure openings are formed. Specifically, a etch mask can be produced by applying a photoresist to the surface to be etched; exposing the photoresist to a pattern of radiation; and then developing the pattern into the photoresist utilizing conventional resist developer to produce the etch mask. Once the patterning of the photoresist is completed, the sections covered of the material stack covered by the etch mask are protected while the exposed regions are removed using an etching process that removes the unprotected regions. In some embodiments, the etch process may be an anisotropic etch that removes the exposed portions of the dielectric cap layer 52, the second dielectric spacer layer 51, and the first dielectric spacer layer 40 to expose a surface of the electrically conductive surface region 20. In some embodiments, the etch process for forming the fin structure openings may be selective to the material of the electrically conductive surface region 20. For example, the etch process for forming the fin structure openings can be a reactive ion etch process.

Still referring to FIG. 4, following the formation of the fin structure openings, a thermal oxidation process forms a dielectric surface 61 of the sidewall surface of the sacrificial gate layer 60 that are exposed within the fin structure openings. In the embodiments in which the sacrificial gate layer 60 is composed of a silicon containing material, the dielectric surface 61 may be composed of an oxide, such as silicon oxide.

In a following process step, the fin structures 25' are formed filling the fin structure openings using an epitaxial deposition process that employs the electrically conductive surface region 20 at the base of the fin structure openings as an epitaxial deposition growth surface. The epitaxial semiconductor material that provides the fin structures 25a, 25b does not form on dielectric surfaces, such as the dielectric cap layer 53 or the dielectric surface 61 of the sacrificial gate layer 60. The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. The epitaxial deposition process may employ the deposition chamber of a chemical vapor deposition type apparatus, such as a PECVD apparatus.

The epitaxially formed fin structures 25' can be a type IV semiconductor containing material layer. A number of different sources may be used for the epitaxial deposition of the in situ doped n-type semiconductor material 15. In some embodiments, the gas source for the deposition of an epitaxially formed in situ doped n-type semiconductor material 15 may include silicon (Si) deposited from silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. In other examples, when the in situ doped n-type semiconductor material 15 includes germanium, a germanium gas source may be selected from the group consisting of germane, digermane, halogermane, dichlorogermane, trichlorogermane, tetrachlorogermane and combinations thereof. The temperature for epitaxial silicon germanium deposition typically ranges from 450° C. to 900° C. Although higher temperature typically results in faster deposition, the faster deposition may result in crystal defects and film cracking.

The geometry and composition of the fin structures 25' that are formed in FIG. 4 have been described in greater detail with reference to FIGS. 1A and 1B. In some embodiments, the fin structure 25a to the vertical transistor device 100a has the same composition as the fin structure 25b for the vertical diode connected transistor device 100b. In other embodiments, the fin structure 25a to the vertical transistor device 100a has a different composition as the fin structure 25b for the vertical diode connected transistor device 100b. To provide that the fin structures 25a, 25b have different epitaxial compositions, block masks (not shown) may be employed to independently form each fin structure 25', as illustrated in FIG. 4, to provide the different compositions for the fin structures 25a, 25b of the devices 100a, 100b in FIGS. 1A and 1B.

Figure 5:
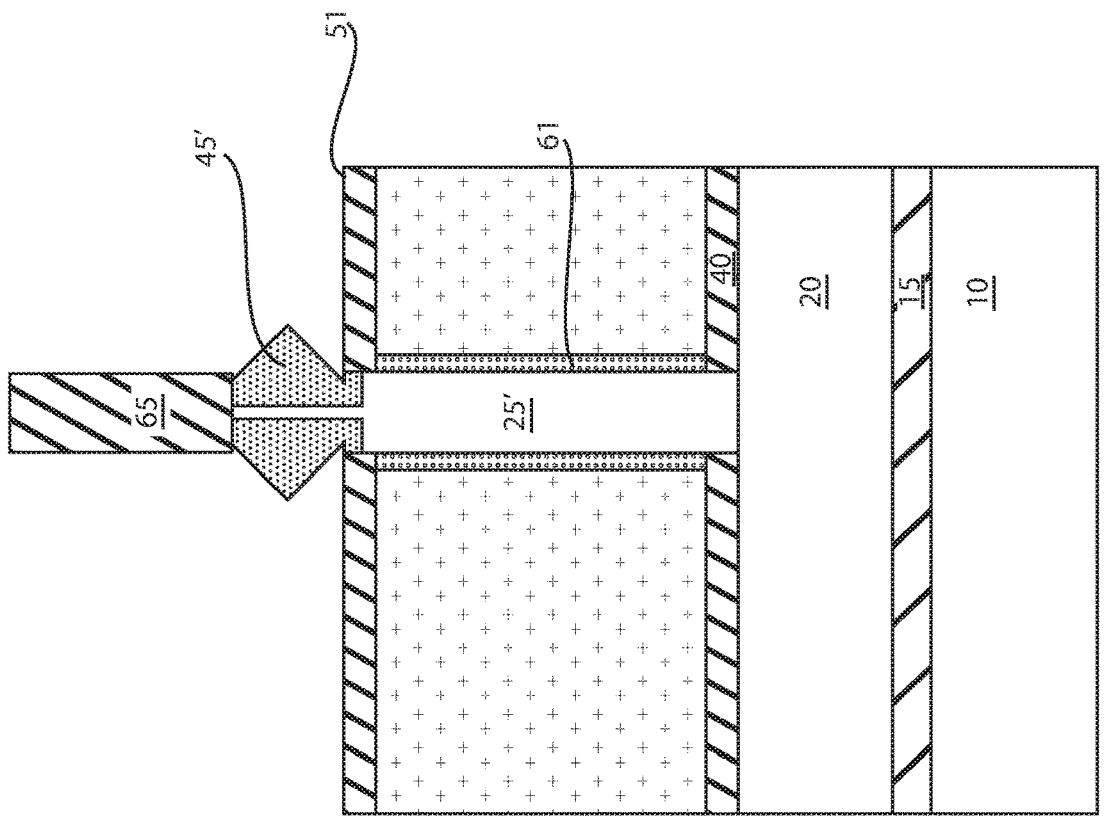
FIG. 5 is a side-cross sectional view depicting removing a portion of the replacement gate stack, and forming a source/drain region on an exposed surface of the fin structure.

FIG. 5 depicts removing a portion of the replacement gate stack, and forming a source/drain region 45' on an exposed surface of the fin structure 25'. It is noted that the source/drain region identified by reference number 45' can provide either of the transistor second source/drain region 45a, or the diode second source/drain region 45b, as depicted in FIGS. 1A and 1B. In the embodiments, in which the transistor second source/drain region 45a, and the diode second source/drain region 45b have the same composition and conductivity type, they may be formed on separate fin structures 25a, 25b simultaneously. In the embodiments, in which the transistor second source/drain region 45a, and the diode second source/drain region 45b have a different composition and conductivity type, they may be formed on separate fin structures 25a, 25b separately, using block masks to independently process each of the in structures 25a, 25b that are present on the same substrate.

Referring back to FIG. 5, the process flow for forming the source/drain region 45' may begin with recessing the fin structure 25'. The fin structure 25' may be recessed using an etch that is selective to the cap dielectric layer 52. Etching the epitaxially formed fin structures 25' forms a recess in the upper portions of the fin structure opening. The recess is filled with a deposited dielectric material to provide the dielectric cap 65. In some embodiments, the dielectric cap 65 may be composed of a nitride, such as silicon nitride, that is deposited using chemical vapor deposition (CVD), such as plasma enhanced chemical vapor deposition (PECVD).

Following formation of the dielectric cap 65, the cap dielectric layer 52 may be removed. The cap dielectric layer 52 may be removed by an etch process, such as a dry etch process, e.g., reactive ion etching, or wet etch, e.g., chemical etching, in which the etch process may be selective to the second dielectric spacer layer 50. Because the fin structure 25' is only recessed to a portion of the thickness of the cap dielectric layer 52, removing the cap dielectric layer 52 exposes a sidewall portion of the fin structure 25'. The second source/drain region 45' may then be epitaxially formed on the exposed sidewall of the fin structure 25'. The epitaxial deposition process for forming the second source/drain region 45' is similar to the epitaxial deposition process that provides the fin structure 25'. For example, the second source/drain region 45' may be composed of a type IV semiconductor such as silicon. Therefore, the above process conditions for forming the fin structures 25' is equally applicable for forming at least one embodiment of a second source/drain region 45'. It is noted that the epitaxial deposition process does not form epitaxial material on surfaces that are not composed of semiconductor material, such as the dielectric surfaces of the second dielectric spacer layer 40, and the dielectric surfaces of the dielectric cap 65. In the embodiment that is depicted in FIG. 5, the epitaxial semiconductor material that provides the second source/drain region 45' may have a diamond like geometry.

The epitaxial semiconductor material that provides the second source/drain regions 45' is doped to an n-type or p-type conductivity. The n-type or p-type dopant may be formed using in situ doping or ion implantation. By "in-situ" it is meant that the dopant that dictates the conductivity type of the semiconductor material is introduced during the process step, e.g., epitaxial deposition, that forms the semiconductor material. One example, of an n-type gas dopant source may include arsine ($A_xH_3$), phosphine ($PH_3$) and alkylphosphines, such as with the empirical formula $R_xPH_{(3-x)}$, where R=methyl, ethyl, propyl or butyl and x=1, 2 or 3. A p-type dopant, such as borane and diborane gas, may be employed to in situ dope the second source/drain region 45'.

Figure 6:
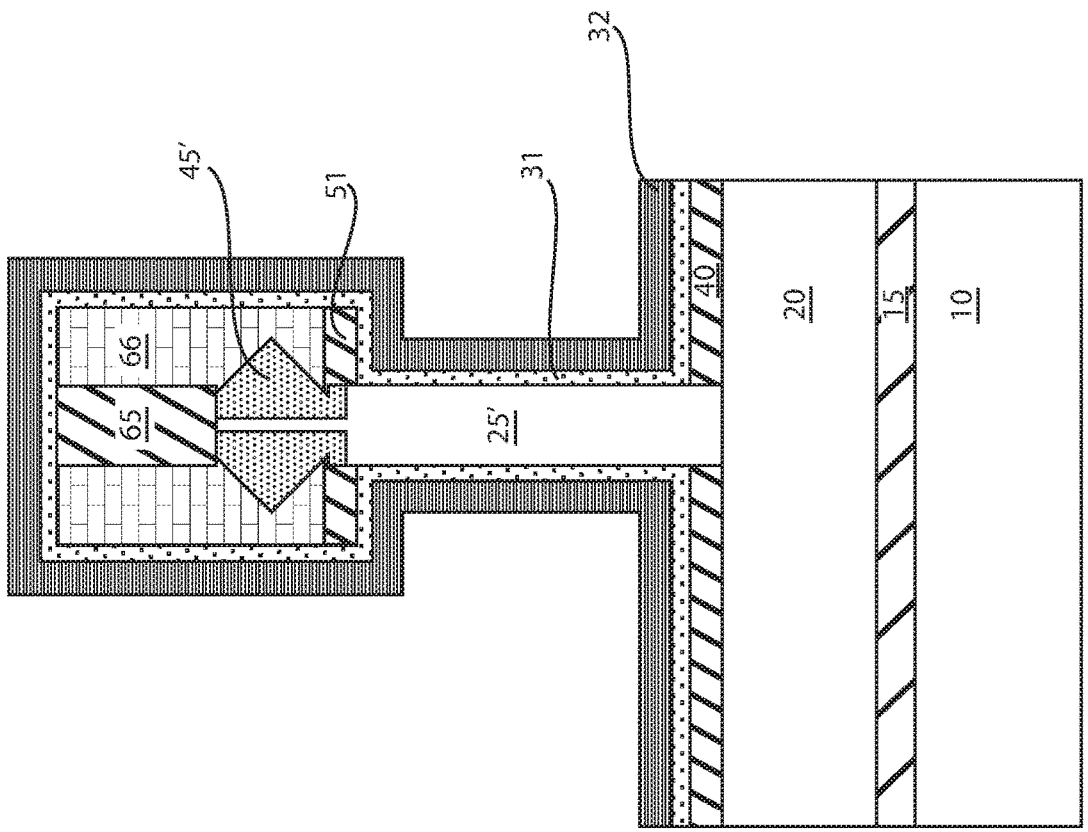
FIG. 6 is a side-cross sectional view depicting forming a gate dielectric on the fin structure, and forming a work function adjusting metal layer on the gate dielectric, in accordance with one embodiment of the present disclosure.

FIG. 6 depicts forming a gate dielectric 31 on the fin structure 25', and forming a work function adjusting metal layer 32 on the gate dielectric 31. In some embodiments, the process flow for forming the gate dielectric 31 may begin with forming an encapsulating spacer 66 around the second source/drain region 45'; etching portions of the second dielectric spacer layer 51, and sacrificial gate layer 60 with an anisotropic etch that is selective to the first dielectric spacer 40; employing an isotropic etch to expose the sidewall surfaces of the fin structure 25'; and forming the gate dielectric layer 31 on the exposed sidewall surfaces of the fin structure 25'.

The encapsulating spacers 66 are formed on the exposed upper sidewalls of the second source/drain regions 45' using deposition process, such as plasma enhanced chemical vapor deposition (PECVD), following by an anisotropic etchback process, such as reactive ion etch. The encapsulating spacers 66 may also extend along sidewalls of the dielectric fin cap 65, and have an upper surface that is coplanar with the upper surface of the dielectric fin cap 65.

Following formation of the encapsulating spacers 66, an anisotropic etch process, such as reactive ion etch (RIE), removes the portions of the second dielectric spacer layer 51, and the sacrificial gate structure layer 60 that are not directly underlying the encapsulating dielectric spacers. The etch process at this stage of the process flow may be selective to the encapsulating spacers 66, the dielectric fin cap 65, and the second dielectric spacer layer 51. The remaining portion of the sacrifice gate structure layer 60 that is underlying the encapsulating spacers 66 may then be removed by an isotropic etch, such as a plasma etch or wet chemical etch, which may be selective to the dielectric surface 61 of the sidewall surface of the sacrificial gate layer 60. Thereafter, the remaining dielectric surface 61 may be removed by an etch that is selective to the fin structures 25', which may also be an isotropic etch. Following the isotropic etch, the sidewalls of the fin structures 25' that provide the channel regions vertical transistor device 100a and the vertical diode connected transistor device 100b may be exposed.

Referring to FIG. 6, the gate dielectric 31 may then be formed on the exposed surfaces of the fin structures 25'. Similar to the previous process steps, when the gate dielectric 31 for the gate structures 30a, 30b of the vertical transistor device 100a, and the vertical diode connected transistor device 100b have the same composition, the dielectric layer 31 for the gate structures for each of these devices may be simultaneously formed. In other embodiments, when the gate dielectric 31 for the gate structure 30a of the vertical transistor device 100a has a different composition than the dielectric layer 31 for the gate structure 30b of the vertical diode connected transistor device 100b, blocks masks may be employed to independently form the dielectric layers on the appropriate fins structures 25a, 25b.

In some embodiments the gate dielectric 31 may be composed of a high-k gate dielectric. As used herein, "high-k" denotes a dielectric material featuring a dielectric constant (k) higher than the dielectric constant of SiO2 at room temperature. For example, the gate dielectric layer 31 may be composed of a high-k oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high-k dielectric materials for the gate dielectric 31 include hafnium silicate, hafnium silicon oxynitride or combinations thereof. The gate dielectric 31 may be deposited using chemical vapor deposition methods, such as plasma enhanced chemical vapor deposition (PECVD). In other embodiments, the gate dielectric 31 may be deposited using atomic layer deposition (ALD).

In the embodiment that is depicted in FIG. 6, the material layer that provides the gate dielectric 31 is blanket deposited atop the entirety of the structure, and is therefore initially present on the exposed surfaces of the fin structures 25', as well as the upper surfaces of the first dielectric spacer 40, the fin spacers 66, and the dielectric fin cap 65.

FIG. 6 further depicts forming a metal work function adjusting layer 32 on the gate dielectric layer 31. The composition of the metal work function adjusting layer 32 has been described above with reference to FIGS. 1A and 1B. Similar to the gate dielectric layer 31, the metal work function adjusting layer 32 may be simultaneously formed for both the vertical transistor device 100a and the vertical diode connected transistor device 100b, when the composition of this layer is the same in both devices; but when the composition of this layer in the vertical diode connected transistor device 100b is different from the composition of this layer in the vertical transistor device 100a, block masks may be employed to allow for independent processing for the different devices. The metal work function adjusting layer 32 may be deposited by CVD, e.g., plasma enhanced chemical vapor deposition (PECVD). In other examples, the metal work function adjusting layer 32 may be deposited using physical vapor deposition, such as sputtering. In yet further examples, the metal work function adjusting layer 32 may be deposited using plating, electroplating, electroless deposition, and combinations thereof.

Figure 7:
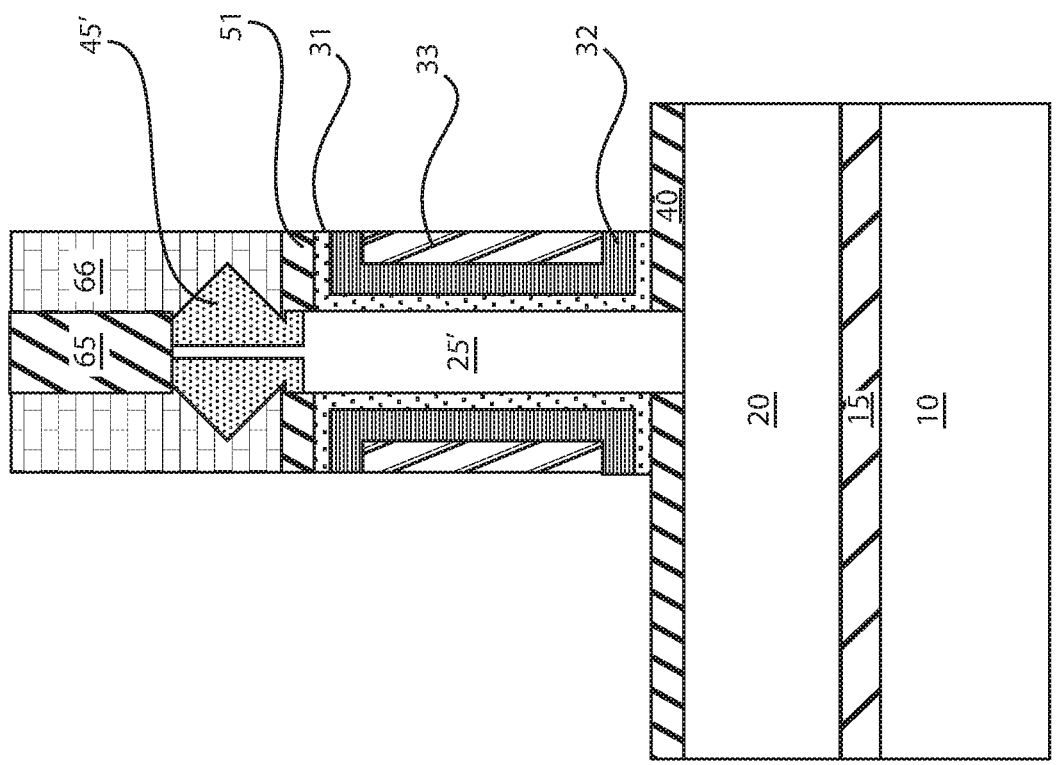
FIG. 7 is a side cross-sectional view depicting forming a first metal gate fill on the material stack of the work function adjusting metal layer and the gate dielectric, in accordance with one embodiment of the present disclosure.

FIG. 7 depicts forming a first metal gate fill 33 on the material stack of the work function adjusting metal layer 32 and the gate dielectric 31. The first metal gate fill 33 provide the gate electrode 33 for the vertical transistor device 100a, and provides a portion of the gate electrode 33, 34 for the vertical diode connected transistor device 100b. The first metal gate fill 33 may be formed directly on the metal work function adjusting layer 32 and may be composed of a metal selected from tungsten (W), tungsten nitride (WN) or combinations thereof. In one or more embodiments, the first metal gate fill 33 is tungsten (W). In another embodiments, the first metal gate fill 33 may be doped semiconductor material, such as n-type doped polysilicon. The material layer for the first metal gate fill 33 may be deposited by CVD, e.g., plasma enhanced chemical vapor deposition (PECVD). In other examples, the material layer for the first metal gate fill 33 may be deposited using physical vapor deposition, such as sputtering. In yet further examples, the material layer for the first metal gate fill 33 may be deposited using plating, electroplating, electroless deposition, and combinations thereof.

The process flow that has been described with reference to FIGS. 3-7 may be applied equally to forming both the vertical diode connected transistor device 100b and the vertical transistor device 100a that is depicted in FIGS. 1A and 1B. The following process step that is described with reference to FIG. 8A is applied only to the portions of the substrate in which the vertical diode connected transistor device 100b is to be formed. As will be described with reference to FIG. 8A, to provide the vertical diode connected transistor device 100b, a portion of the first dielectric spacer 40 is removed, and a second metal gate fill 34 is formed in direct contact with the electrically conductive surface region 20 that provides the first diode source/drain region. The second metal gate fill 34 provides for direct electric contact between the gate structure 30b and the first diode source/drain region of the vertical diode connected transistor device 100b. The first dielectric spacer 40 is not removed from the vertical transistor device 100a, and provides that the first gate structure 30a is isolated from the electrically conductive surface region 20 that provides the first transistor source/drain region of the vertical transistor device 100a. To protect the first dielectric spacer 40 from being removed from the portions of the substrate in which the vertical transistor device 100a is being formed a block mask, such as a photoresist mask, may be formed overlying the vertical transistor device regions, while leaving the vertical device regions exposed.

Figure 8:
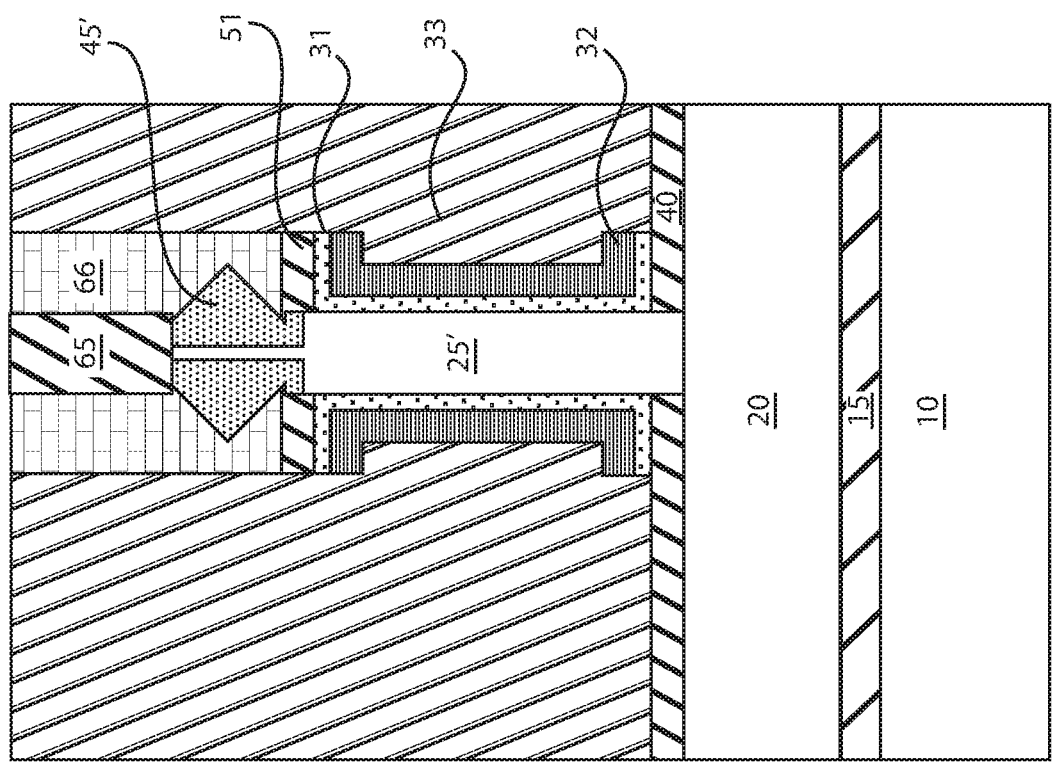
FIG. 8 is a side cross-sectional view depicting patterning the first metal gate fill that is depicted in FIG. 7 with an etch that removes a portion of the first dielectric spacer, i.e., bottom spacer, for producing a vertically orientated diode connected transistor.

FIG. 8 depicts patterning the first metal gate fill 33 that is depicted in FIG. 7 with an etch sequence that also removes a portion of the first dielectric spacer 40, i.e., bottom spacer, for producing a vertical diode connected transistor device 100b. The first metal gate fill 33 may be patterned using the encapsulating spacer 66 and the dielectric cap 65 as an etch mask. The etch process for patterning the first metal gate fill 33 may be an anisotropic etch, such as reactive ion etch (RIE). A portion of the first metal gate fill 33 remains underlying the encapsulating spacer 66 in direct contact with the metal work function adjusting layer 32. The etch process for pattering the first metal gate fill 33 may also remove a portion of the first dielectric spacer 40 to expose the electrically conductive surface region 20. In another embodiment, a first etch stage may remove the first metal gate fill 33 selectively to the first dielectric spacer 40, and a second etch stage, which can employ a different etch chemistry, removes the exposed portion of the first dielectric spacer selectively to the electrically conductive surface region 20.

Figure 9:
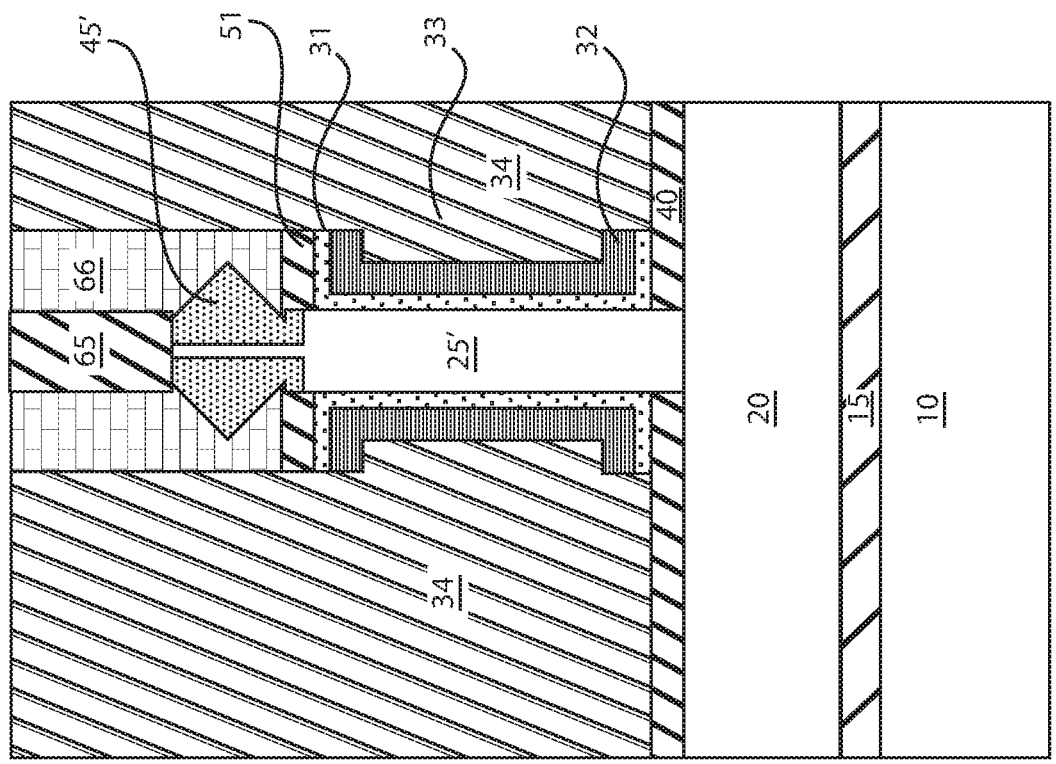
FIG. 9 is a side cross-sectional view depicting forming a second metal fill that is in direct electrical contact with the portion of the electrically conductive surface region that is exposed by removing the dielectric spacer

FIG. 9 depicts forming a second metal gate fill 34 that is in direct electrical contact with the portion of the electrically conductive surface region 20 that is exposed by removing the first dielectric spacer 40. Similar to the process step that is depicted in FIG. 8, the second metal gate fill 34 is only formed in the regions of the substrate that are being processed to form the vertical diode connected transistor devices 100b. During the process step that is depicted in FIG. 9, the portions of the substrate in which the vertical transistor devices 100a are being formed may be covered with a block mask.

The second metal gate fill 34 is formed filling the opening provided by the etch process that removes the exposed portions of the first metal fill 33 and the first dielectric spacer 40 to expose the electrically conductive surface region 20. The second metal gate fill may be formed directly on the remaining portion of the first metal gate fill 33 and may be composed of a metal selected from tungsten (W), tungsten nitride (WN) or combinations thereof. In one or more embodiments, the second metal gate fill 33 is tungsten (W). In another embodiments, the second metal gate fill 33 may be doped semiconductor material, such as n-type doped polysilicon. The material layer for the second metal gate fill 34 may be deposited by CVD, e.g., plasma enhanced chemical vapor deposition (PECVD). In other examples, the material layer for the second metal gate fill 34 may be deposited using physical vapor deposition, such as sputtering. In yet further examples, the material layer for the second metal gate fill 34 may be deposited using plating, electroplating, electroless deposition, and combinations thereof.

As illustrated in FIG. 9, the second metal gate fill 34 is formed in direct contact with the electrically conductive surface region that provides the first diode source/drain region of the vertical diode connected transistor device 100b.

Figure 10A:
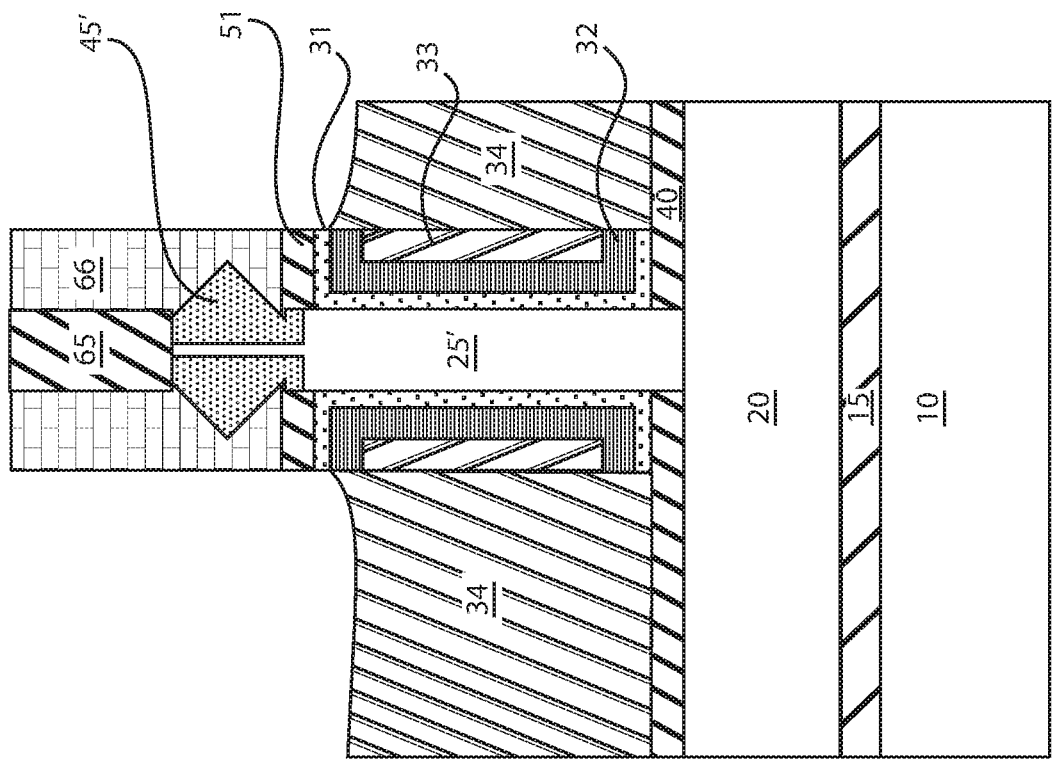
FIG. 10A is a side cross-sectional view depicting recessing the second metal fill to define a gate electrode for a vertical diode connected transistor device.
Figure 10B:
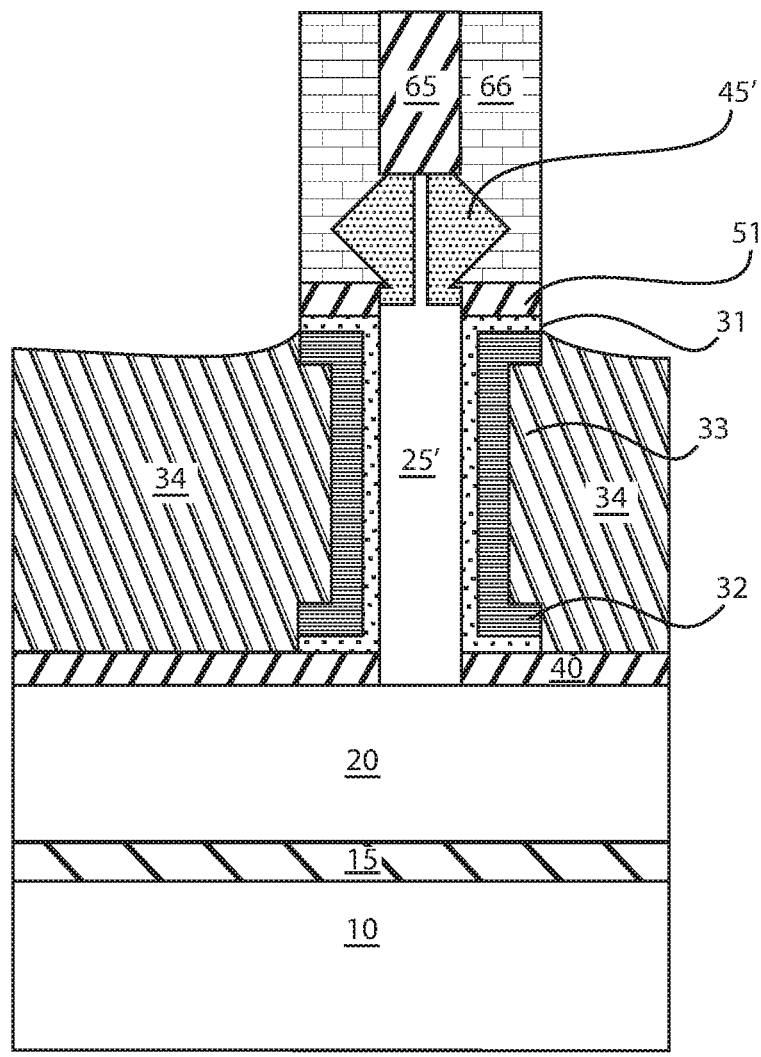
FIG. 10B is a side cross-sectional view depicting recessing the first metal fill to device a gate electrode for a vertical transistor device.

FIG. 10A depicting recessing the second metal gate fill 34 to define a gate electrode 33, 34 for a vertical diode connected transistor device 100b. The first metal gate fill 33 may also be recessed to define the gate electrode 33 of the vertical transistor device 100a, as depicted in FIG. 10B. An etch process may be employed to recess the first and second metal gate fill 33, 34. To recess the second metal gate fill 34 to define the gate electrode 33, 34 of the vertical diode connected transistor device 100b, the etch process may be applied to the structure depicted in FIG. 9. To recess the first metal gate fill 33 to define the gate electrode 33 of the vertical transistor device 100a, the etch process may be applied to the structure depicted in FIG. 7.

Referring to FIGS. 1A and 1B, an interlevel dielectric layer 70 may be formed over the vertical diode connected transistor device 100b and the vertical transistor device 100a, and may be composed of any dielectric material, such as an oxide, nitride or oyxnitride material. For example, the interlevel dielectric layer 70 may be composed of any dielectric material used in microelectronic and nanoelectronic structures, which can include $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). The interlevel dielectric layer 70 may be deposited using chemical vapor deposition, deposition from solution, spin on deposition and combinations thereof. Following deposition, a planarization process may be applied to the upper surface of the interlevel dielectric layer 70.

Referring to FIGS. 1A and 1B, via contacts 75, 76, 77, 78 may be formed to each of the electrically conducive surface region 20 that provides the first diode source/drain region and the first transistor source/drain region, the second source/drain region 45a of the vertical transistor, the second source drain region 45b of the vertical diode connected transistor device, and the gate structure 30a of the vertical transistor device 100a.

The via contacts 75, 76, 77, 78 may be produce by forming a via opening through the interlevel dielectric layer 70; and filling the via opening with an electrically conductive material. The via opening may be formed using photolithography and etch processes. For example, a photoresist mask may be formed exposing the portion of the dielectric material layers in which the via opening is to be formed, wherein following formation of the photoresist mask, the via opening may be etched into the interlevel dielectric using an etch process, such as reactive ion etch. The via opening may be filled with a doped semiconductor material, such as n-type doped polysilicon, or a metal, such as copper, aluminum, titanium, tungsten, platinum or combinations thereof, to form the via contacts 75, 76, 77, 78. The electrically conductive material may be deposited into the via opening using physical vapor deposition (PVD). Examples of PVD processes suitable for depositing the metal for the via contacts 75, 76, 77, 78 include plating, electroplating, electroless plating, sputtering and combinations thereof.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a structure and method for forming diode connected vertical transistor, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method of forming an electrical device comprising:
forming a transistor device in a first region of a substrate comprising a transistor channel, a first transistor source/drain region that is provided by an electrically conductive region at a first end of the transistor channel, and a transistor gate structure that is separated from the first transistor source/drain region of the transistor by a dielectric spacer; and
forming a diode connected transistor device in a second region of the substrate comprising a diode channel, a first diode source/drain region provided by the electrically conductive region at a first end of the diode channel, and a diode gate structure in direct contact with the first diode source/drain region.

2. The method of claim 1, further comprising forming a second transistor source/drain region that is present at a second end of the transistor channel that is opposing the first end that is in contact with the first transistor source/drain region.

3. The method of claim 1, further comprising forming a second diode transistor source/drain region that is present at a second end of the diode channel that is opposing the first end that is in contact with the first diode source/drain region.

4. The method of claim 1, wherein the electrical device is a current mirror.

5. The method of claim 1, wherein the electrical device is a comparator.

6. The method of claim 1, wherein the electrical device is a sense amplifier.

7. The method of claim 1, further comprising forming a first terminal to the electrically conductive region that simultaneously provides the first transistor source/drain region and the first diode source/drain region, and forming a second terminal in direct electrical contact to a second diode source/drain region.

8. The method of claim 1, wherein the transistor gate structure is formed in a process that includes forming the dielectric spacer on the electrically conductive region, forming a transistor gate dielectric on the transistor channel region, and forming a gate conductor on the gate dielectric.

9. The method of claim 8, wherein the transistor gate structure further comprises a work function adjusting metal layer.

10. The method of claim 8, wherein the diode gate structure is formed by a sequence that includes forming a diode gate dielectric on the diode channel region and on a portion of the dielectric spacer that is present on the electrically conductive region in which the diode connected transistor device is formed, removing a portion of the dielectric spacer to expose the electrically conductive region including an overlying portion of the diode gate dielectric and forming a gate electrode.

11. The method of claim 10, wherein the diode gate structure further comprises a work function adjusting metal layer.

12. A method of forming an electrical device comprising:
forming a transistor device in a first region of a substrate comprising a transistor channel, a first transistor source/drain region that is provided by an electrically conductive region at a first end of the transistor channel region, and a transistor gate structure that is separated from the first transistor source/drain region of the transistor by a dielectric spacer, wherein the transistor gate structure is formed in a process that includes forming the dielectric spacer on the electrically conductive surface, forming a transistor gate dielectric on the vertically orientated channel region, and forming a gate conductor on the gate dielectric; and
forming a diode connected transistor device in a second region of the substrate comprising a diode channel, a first diode source/drain region provided by the electrically conductive surface at a first end of the diode channel, and a diode gate structure in electrical contact with the first diode source/drain region, wherein the diode gate structure is formed by a sequence that includes forming a diode gate dielectric on the diode channel region and on a portion of the dielectric spacer that is present on the electrically conductive surface region in which the vertically orientated diode is formed.

13. The method of claim 12, wherein the electrical device is a current mirror.

14. The method of claim 12, wherein the electrical device is a comparator.

15. The method of claim 12, wherein the electrical device is a sense amplifier.

16. The method of claim 12, wherein the transistor gate structure further comprises a work function adjusting metal layer.

17. The method of claim 12, wherein the diode gate structure further comprises a work function adjusting metal layer.

18. The method of claim 12 further comprising removing a portion of the dielectric spacer to expose the electrically conductive region including an overlying portion of the diode gate dielectric and forming a gate electrode.

19. The method of claim 12, wherein the diode connected transistor device and the transistor device have substantially a same height.

20. The method of claim 19, wherein the substrate is a semiconductor on insulator substrate, wherein the electrically conductive region is provided by an upper semiconductor layer of the semiconductor on insulator substrate.

* * * * *